(12) United States Patent
Pezzani (10) Patent No.: US 6,411,155 B2
(45) Date of Patent: Jun. 25, 2002

(54) POWER INTEGRATED CIRCUIT

(75) Inventor: Robert Pezzani, Vouvray (FR)

(73) Assignee: SGS-Thomson Microelectronics S.A., Gentilly (FR)

( * ) Notice: Subject to any disclaimer, the term of this patent is extended or adjusted under 35 U.S.C. 154(b) by 0 days.

(21) Appl. No.: 09/756,389

(22) Filed: Jan. 8, 2001

Related U.S. Application Data (62) Division of application No. 09/373,464, filed on Aug. 12, 1999, which is a division of application No. 08/577,209, filed on Dec. 22, 1995, now Pat. No. 6,075,277.

(30) Foreign Application Priority Data

Dec. 30, 1994 (FR) .............................................. 9416011

(51) Int. Cl.$^7$ ................................................ H01J 19/82
(52) U.S. Cl. ...................... 327/531; 327/325; 327/584
(58) Field of Search ............................... 327/309, 321,
327/325, 330, 583, 584, 494, 502, 504,
505, 531; 361/91

(56) References Cited

U.S. PATENT DOCUMENTS

| | | | | |
|---|---|---|---|---|
| 3,246,206 A | | 4/1966 | Chowdhuri .................... 317/31 |
| 3,643,127 A | * | 2/1972 | Laupman ..................... 315/101 |
| 3,795,846 A | | 3/1974 | Ogawa et al. ............... 257/502 |
| 4,005,350 A | | 1/1977 | Brenneisen | |
| 4,158,214 A | | 6/1979 | Bolus et al. ................... 361/91 |
| 4,218,694 A | * | 8/1980 | Graybowski ................. 257/705 |
| 4,278,985 A | | 7/1981 | Stobbs ......................... 357/15 |
| 4,286,280 A | | 8/1981 | Sugawara .................... 257/502 |
| 5,072,287 A | | 12/1991 | Nakagawa et al. .......... 257/500 |
| 5,365,086 A | | 11/1994 | Pezzani ....................... 257/157 |
| 5,371,647 A | * | 12/1994 | Fried et al. .................. 361/119 |
| 5,401,984 A | | 3/1995 | Byatt et al. .................. 257/499 |
| 5,569,609 A | | 10/1996 | Salbreux | |
| 5,627,399 A | | 5/1997 | Fujii ........................... 257/501 |
| 5,817,546 A | | 10/1998 | Ferla et al. .................. 438/138 |
| 6,017,778 A | | 1/2000 | Pezzani | |
| 6,075,277 A | | 6/2000 | Pezzani | |

FOREIGN PATENT DOCUMENTS

| | | | |
|---|---|---|---|
| DE | A-34 21 185 | 12/1985 | ........... H01L/27/04 |
| EP | A-0 490 788 | 12/1991 | ........... H02H/9/04 |
| FR | A-2 335 957 | 12/1995 | ........... H01L/27/06 |
| JP | 63 65641 | 3/1988 | |

OTHER PUBLICATIONS

French Search Report from French Patent Application No. 94 16011, filed Dec. 30, 1994.

French Search Report from French Patent Application No. 93 04860, filed Jan. 7, 1994.

Office Action Mailed Oct. 22, 2001 for Application Serial No. 09/672,922, filed Sep. 28, 2000 Entitled "Power Integrated Circuit", Examiner: Stephen W. Jackson, Art Unit: 2836.

Control Methods involving semiconductor components, formerly entitled *A Power Integrated Circuit*.

* cited by examiner

*Primary Examiner*—Toan Tran
(74) *Attorney, Agent, or Firm*—Wolf, Greenfield & Sacks, P.C.; James H. Morris (57) ABSTRACT

A monolithic assembly includes vertical power semiconductor components formed throughout the thickness of a low doped semiconductive wafer of a first conductivity type, whose bottom surface is uniformly coated with a metallization. At least some of these components, so-called autonomous components, are formed in insulated sections of the substrate, whose lateral insulation is provided by a diffused wall of the second conductivity type and whose bottom is insulated through a dielectric layer interposed between the bottom surface of the substrate and the metallization.

22 Claims, 8 Drawing Sheets

POWER INTEGRATED CIRCUIT

This application is a division of application Ser. No. 09/373,464, filed Aug. 12, 1999, entitled POWER INTEGRATED CIRCUIT, now pending which is a division of 08/577,209, filed Dec. 22, 1995, entitled POWER INTEGRATED CIRCUIT, and now U.S. Pat. No. 6,075,277.

BACKGROUND OF THE INVENTION

1. Field of the Invention

The present invention relates to the field of semiconductor components, hereinafter referred to as power components, capable of withstanding high voltages and/or transmitting high powers. These components are vertically disposed over the whole thickness of a semiconductive layer from a low doped substrate so that they have high breakdown voltages.

2. Discussion of the Related Art

Conventionally, such power components are thyristors, triacs, bipolar transistors, power MOS transistors, insulated-gate bipolar transistors (IGBTs), etc.

Components designed to control high electrical power dissipate thermal energy. Thus, the bottom surface of these components is metallized and mounted on a heat sink. As a consequence, if it was desired to form several power components on the same chip, this has only been possible when these various components have one common terminal.

SUMMARY OF THE INVENTION

An object of the present invention is to fabricate power integrated circuits, i.e. to group on the same substrate vertical components having at least one layer constituted by a low doped portion of this substrate, the bottom surface of the substrate being metallized to be welded or connected in another suitable way to a heat sink.

To achieve this and other objects, the present invention provides for monolithically assembling vertical power semiconductor components throughout the thickness of a low doped semiconductive wafer of a first conductivity type. The bottom surface of the wafer is uniformly coated with a metallization. At least some of these components, so-called "autonomous" components, are formed in insulated sections of the substrate. These "insulated sections" are laterally insulated by a diffused wall of the second conductivity type and their bottom is insulated through a dielectric layer interposed between the bottom surface of the substrate and the metallization of the bottom surface.

When the semiconductive region of the bottom surface of an autonomous component is of the first conductivity type, an overdoped region of the first conductivity type is provided on the bottom surface and an overdoped region of the first conductivity type, from which a contact is taken, is provided on the upper surface above at least a portion of the overdoped region of the bottom surface.

When the semiconductive region of the bottom surface of an autonomous component is of the second conductivity type, this region laterally extends up to an insulation wall, a contact being taken again from the upper surface of the insulation wall, the dielectric layer extending beneath the lower foundations of the insulation wall.

In at least one insulated section, logic components can be formed.

The present invention also applies to the fabrication of a monolithic diode bridge including, in a substrate of a first conductivity type, two first vertical diodes whose common cathode corresponds to a bottom surface metallization, and, in an insulated section of the substrate (the insulated section being separated from the rest of the substrate by an insulation wall of the second conductivity type), two second vertical diodes whose common anodes correspond to a layer of the second conductivity type formed on the bottom surface whose contact is taken from the upper surface through the insulation wall, the bottom surface of these two diodes being coated with an insulating layer interposed between the semiconductive wafer and the bottom surface metallization.

The invention also applies to a component forming a single-phase rectifying bridge that includes first and second pairs of head-to-tail connected diodes disposed between a.c. supply terminals, the junctions between the diodes of each pair of diodes constituting a d.c. supply terminal, and two head-to-tail Shockley diodes in antiparallel with the diodes of the first pair of diodes. The Shockley diodes and the first pair of diodes are vertically disposed in a semiconductor substrate whose upper surface includes two first metallizations forming a.c. supply terminals, and whose bottom surface includes a third metallization forming a d.c. supply terminal corresponding to the junction of the first two diodes. The second pair of diodes is disposed in an insulated section between a fourth metallization forming a d.c. supply terminal and each metallization forming an a.c. supply terminal.

According to an advantage of the invention, a plurality of vertical components can be formed on a same semiconductive substrate, first vertical components having a common electrode constituted by the bottom surface metallization, and second components being autonomous, i.e., their electrodes can be separately connected to various terminals of other components or to external terminals, none of these electrodes being constituted by the metallization of the bottom surface.

In addition, since the bottom surfaces of the autonomous components are protected by a thin insulating layer, such as a silicon oxide layer, in turn coated with the bottom surface metallization, good heat dissipation is obtained, even for the components whose bottom surface includes this thin layer that is electrically insulating but remains thermally conductive.

Although only some specific components that can be assembled to form a power integrated circuit, as well as possible associated logic circuits and some applications thereof, are described below, the invention is not limited to these particular cases. Those skilled in the art will note an analogy between the autonomous components according to the present invention and individual components of a bipolar integrated circuit. Indeed, in bipolar integrated circuits, most of the components of an integrated circuit are formed in an epitaxial layer, the individual components being mutually insulated by deep diffusions going through the epitaxial layer and their bottom being insulated by buried layers of either conductivity type. According to the present invention, the whole thickness of the substrate corresponds to the epitaxial layer and the bottom junction insulation (buried layer) is replaced with the insulating layer which is interposed between the bottom surface of the substrate and the bottom surface metallization. Those skilled in the art can use this analogy to find further variants and applications of the present invention.

The foregoing and other objects, features, aspects and advantages of the invention will become apparent from the following detailed description of the present invention when taken in conjunction with the accompanying drawings.

As is conventional in integrated circuit representation, it will be noted that the various drawings are not drawn to scale, and in particular, in the cross-sectional views, the relative thicknesses of the various layers are arbitrarily drawn. Also, in the cross-sectional views, the various diffused regions are symbolically drawn with squared corners. In addition, in each case, those skilled in the art can adapt the relative surfaces of the various regions to comply with the required power performance of the component.

It will be clear for those skilled in the art that the present invention describes only basic structures of components and that, in practice, each of these components can be improved and modified to meet specific required functions. For example, thyristors only, and not triacs, are represented and, in most figures, the anode or cathode shorts of these thyristors are not shown.

DETAILED DESCRIPTION

EXEMPLARY COMPONENTS THAT CAN BE ASSEMBLED ACCORDING TO THE INVENTION

Figure 1A:
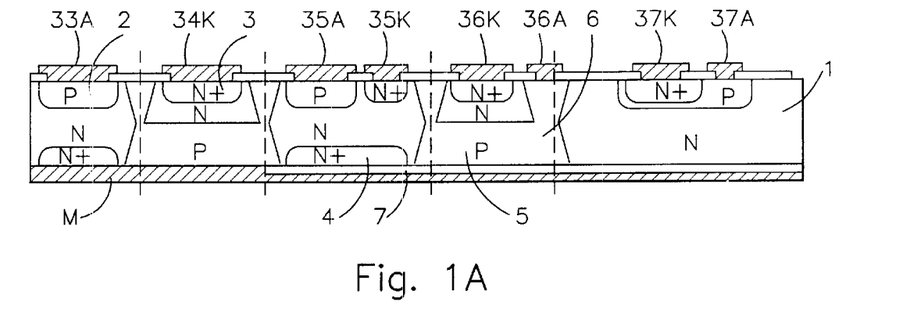
FIGS. 1A and 1B are a cross-sectional view and a schematic view, respectively, of various types of diodes that can be assembled according to the present invention.
Figure 1B:
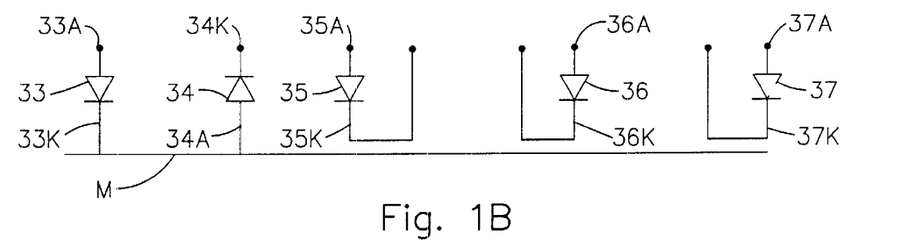

FIG. 1A represents various types of diodes 10 to 14 that can be assembled on a same N-type semiconductive wafer. FIG. 1B symbolically represents each diode of FIG. 1A. The structure is formed from a low doped N-type substrate 1. P-type diffusions 2 can be formed from the upper surface, as well as highly doped N-type diffusions 3. From the bottom surface, highly doped N-type diffusions 4 and highly doped P-type diffusions 5 are formed. In addition, P-type insulation walls 6 are formed from an upper surface diffusion and from a facing bottom surface diffusion. The whole bottom surface is coated with a metallization M. At some places, an insulating layer 7 is interposed between the bottom surface of the component and metallization M. The insulating layer 7 and metallization M can be made of any suitable material or composite material conventionally used for the manufacturing of semiconductive components.

Hereinafter, "insulated section" is to be construed as designating a portion of a silicon wafer laterally insulated by a wall of the second conductivity type and having a bottom insulated by an insulating layer 7.

Diodes 33 and 34 are conventional diodes provided in a power component. Diode 33 vertically includes, from top to bottom, a P-type region, a substrate portion and a N-type region; the upper surface metallization corresponds to its anode 33A and its bottom surface metallization M corresponds to its cathode 33K. Diode 34 vertically includes, from top to bottom, a highly doped N-type region, a portion of the substrate and a highly doped P-type region; its cathode 34K corresponds to an upper surface metallization and its anode corresponds to metallization M.

This conventional implementation of diodes 33 and 34 causes those diodes to have one common terminal. Furthermore, for example, it is impossible to make from such diodes a monolithic diode bridge, in which the diagonally opposed diodes have no common terminal.

Diodes 35 and 36 are "autonomous" diodes, formed in insulated sections according to the present invention, which have the advantage of vertically operating and of having anode and cathode electrodes which are not necessarily common to the electrodes of other components of the circuit.

Diode 35 vertically includes, from top to bottom, a P-type region which corresponds to its anode, a substrate portion and a highly doped N-type region which corresponds to its cathode. Thus, diode 35 is a vertical diode. In addition an N-type region is formed on the upper surface, contacting a cathode metallization 35K.

Diode 36 vertically includes, from top to bottom, an N-type region corresponding to its cathode 36K, a substrate portion and a P-type region diffused from its bottom surface. An anode metallization 36A is formed on the upper surface of the insulation wall, which delineates the insulated section in which diode 36 is formed.

The right portion of FIG. 1 also represents a lateral diode 37 also formed in an insulated section. Diode 37 includes an N-type region contacting a cathode metallization 37K, formed in a P-type well which is diffused in substrate 1 and contacts an anode metallization 37A. Diode 37 is not a power component since it operates laterally and could form an element of a logic circuit associated on a same chip with one or more power components. An aspect of the present invention is also to dispose logic circuits in insulated sections because it was impossible as a practical matter, to integrate such logic elements to power structures when the power structures included four-layer components because of the unavoidable occurrence of spurious vertical thyristors.

It should be noted that the integration of four-layer components (thyristor-type) always raises operation problems for the components integrated in the same chip. Indeed, through lateral coupling, an integrated diode or thyristor forms with other layers of the structure a spurious thyristor whereby the structure may be short-circuited in response to triggering of this spurious thyristor and will therefore not fulfill the required function. In the present case, the lateral and bottom insulations prevent these spurious thyristors, which allows the safe integration of thyristor components with other logic or power components.

Figure 2A:
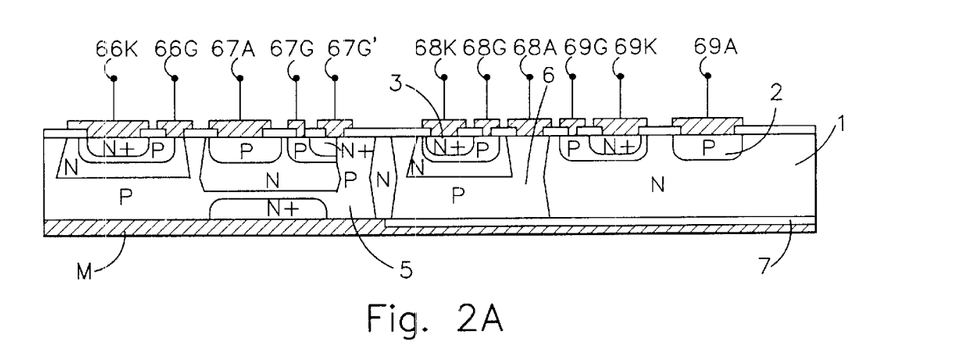
FIGS. 2A and 2B are a cross-sectional view and a schematic view, respectively, of various types of thyristors that can be assembled according to the present invention.
Figure 2B:
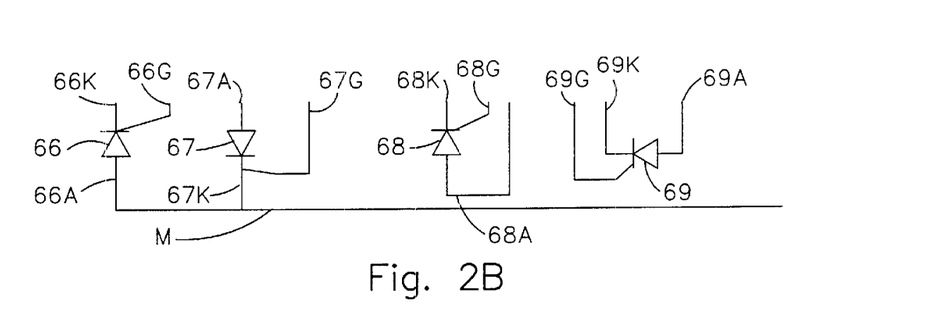

FIGS. 2A and 2B illustrate various thyristor structures that can be used according to the present invention.

The left-hand portion of FIG. 2A illustrates conventional thyristors 66 and 67 whose respective anode and cathode are connected to a bottom surface metallization.

Thyristor 66 includes a vertical N-type region corresponding to its cathode 66K, a P-type region from which a gate contact 66G is taken, a substrate portion 1 and a P-type anode region contacting metallization M which corresponds to anode 66A of the thyristor. Also, FIGS. 2A and 2B show a lateral insulation wall of this thyristor; however, this insulation wall has not in this specific case an insulating function but is conventionally used to form a well-type thyristor capable of withstanding high voltages.

Thyristor 67 is a complex component such as described in U.S. Pat. No. 5,365,086 assigned to the applicant and is represented to clearly demonstrate that the present invention makes it possible to assemble in a single power circuit practically any known elementary component.

The right-hand portion of FIG. 2A represents "autonomous" thyristors 68 and 69 formed in insulated sections.

Thyristor 68 is a vertical power thyristor which includes, from top to bottom, an N-type region, from which are taken the cathode metallization 68K, a P-type region, an N-type substrate portion and a P-type region formed from the bottom surface and contacting an insulation wall 6 on the upper surface of which an anode metallization 68A is taken.

Thyristor 69 is a lateral thyristor which can be part of a logic circuit. Thyristor 69 includes an N-type cathode region contacting a metallization 69K formed in a P-type region from which the gate contact 69G is taken, this P-type region being formed in the substrate. In the same substrate is formed a P-type region contacting the anode metallization 69A. As mentioned above, an advantage of disposing such a lateral thyristor in an insulated section of the wafer is that the layers constituting this thyristor therefore do not constitute spurious elements with other elements of the structure.

Figure 3A:
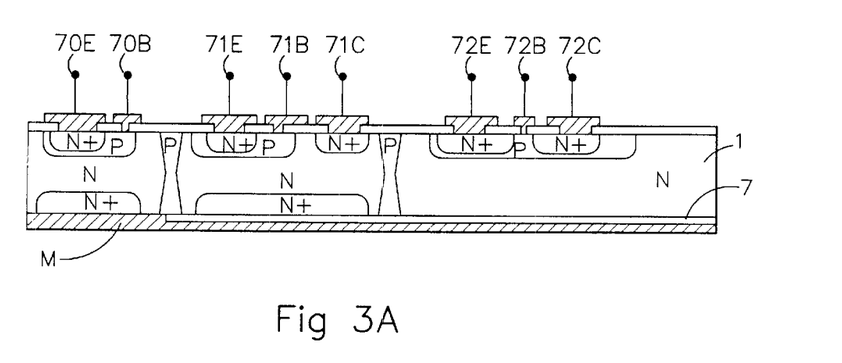
FIGS. 3A and 3B are a cross-sectional view and a schematic view, respectively, of various types of NPN transistors that can be assembled according to the present invention.
Figure 3B:
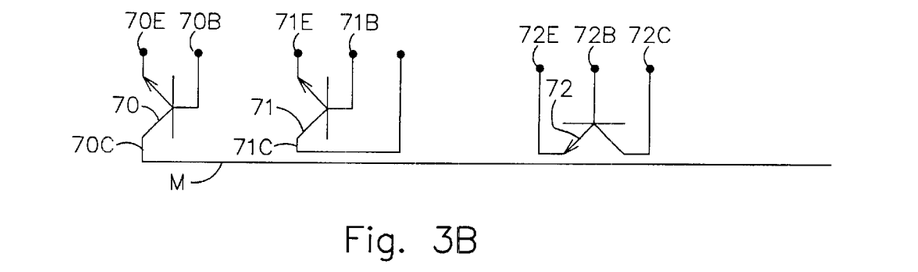

FIG. 3A represents three exemplary NPN transistors 70, 71, 72 fabricated according to the present invention.

Transistor 70 is a conventional vertical transistor which includes an N-type region contacting the emitter metallization 70E, a P-type region contacting the base metallization 70B. This P-type region is formed in a substrate portion and a highly doped N-type region is formed in the bottom surface and contacts the bottom surface M which corresponds to the collector.

Transistors 70 and 71 are formed in insulated sections of the substrate.

Transistor 71 is similar to transistor 70, but includes, on its upper surface, an additional highly doped N-type region facing a portion of the N-type region of the lower surface; this additional N-type region is connected to a collector metallization 71C.

Transistor 72 is a lateral transistor and includes, in a P well, N-type regions contacting emitter metallization 72E and collector metallization 72C, respectively, with region P contacting a base metallization 72B. Transistor 72 can constitute an element of a logic circuit associated with one or more power components.

Figure 4A:
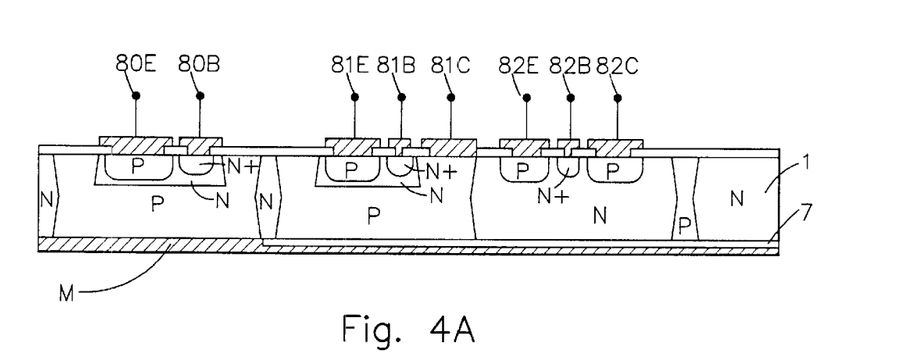
FIGS. 4A and 4B are a cross-sectional view and a schematic view, respectively, of various types of PNP transistors than can be assembled according to the present invention.
Figure 4B:
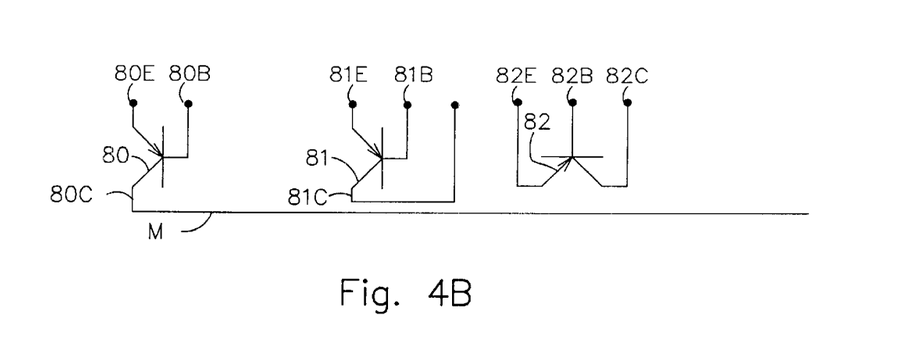

Similarly, FIG. 4A represents three types of PNP transistors 80, 81, 82 which can be fabricated according to the present invention.

The PNP transistor 80 is a conventional power transistor whose bottom surface corresponds to metallization M and which includes, on the upper surface of the substrate, a P-type region contacting an emitter metallization 80E and an N-type region contacting a base metallization 80B. A P-type region contacting the substrate is formed on the bottom surface. Preferably, this P-type region contacts the insulation walls.

Transistor 81 is formed in an insulated section. Its structure is generally the same as that of transistor 80, but the collector contact 81C is taken from the upper surface of the lateral insulation wall.

Transistor 82, also formed in an insulated section, is a PNP lateral transistor complementary to the lateral transistor NPN 72, described above.

Thus, the components illustrated in FIGS. 1–4 represent elements of a library of cells of power or logic components which can be assembled on a same layer according to a desired design.

Depending upon the desired requirements, there is formed power components with a common electrode, or autonomous components formed in one or more insulated sections with electrodes distinct from those of the other components of the same chip.

Of course, the components of FIGS. 1–4 are only exemplary elementary components that can be used. Any conventional power component can effectively be used in monolithic integrated power structures according to the invention. For example, those skilled in the art can easily transform thyristor structures, illustrated in FIG. 2, into triac structures, and can also use both anode-gate thyristors and cathode-gate thyristors.

For the sake of simplification, all the alternatives have not been represented and described. In particular, referring to FIG. 2A, it can be seen that the middle low doped N layer, is not fully used; in fact, an additional so-called "anode gate" electrode can be connected thereto. The manufacturing process is not more complex since this layer is anyhow apparent on the upper surface. Then, each thyristor can be controlled through its cathode gate (not shown) or this anode gate (not shown).

The above description is purposely simplified. In some cases, it is possible and desirable to dispose various components in a same well (with or without insulation of the bottom surface). By way of example, diode 34 can be disposed in the same well as thyristor 67.

With the same rules, passive elements, such as resistors and capacitors can also be added to an integrated circuit according to the present invention.

Moreover, the bottom surface metallization of the component, mainly designed to provide good thermal connection with a heat sink, is not necessarily connected to an external terminal and can merely constitute an internal junction of elementary components of the power integrated circuit. The metallization can also be electrically insulated from a heat sink structure.

Figure 5:
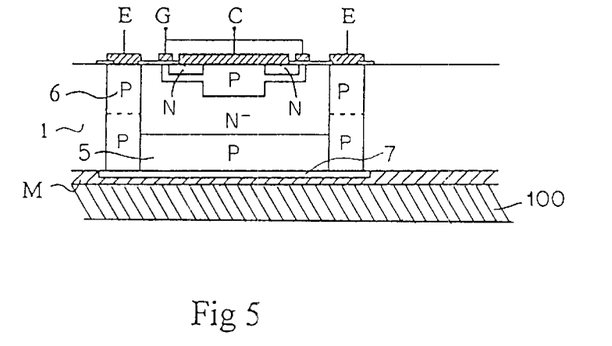
FIG. 5 represents an exemplary cross-sectional view of an autonomous IGBT transistor that can be monolithically integrated according to the present invention.

By way of example only, to clearly show the wide range of applications of the present invention, FIG. 5 represents an IGBT transistor fabricated according to the present invention in the form of an autonomous component in an insulated section of a semiconductive wafer.

FIG. 5 shows again the conventional structure of an IGBT transistor, including, on the upper surface of a substrate 1, a P-type region in which are formed N-type regions extending near the periphery of the P-type region so as to define areas where a channel may be formed, the upper surface of these areas being insulated and covered with a gate metallization G. A collector metallization C contacts N-type regions and a central overdoped portion of the P-type region. A P-type region 5 is also formed from the bottom surface of the substrate. In a conventional structure, P-type region 5 contacts the metallization M of the bottom surface substrate which constitutes its emitter. Here, to render the component autonomous, an insulating layer 7 is formed between the P-type region and metallization M, and the component is surrounded by a P-type insulation wall 6. Emitter contacts E are taken from the upper surface of this wall. The substrate 1 may be optionally mounted to a heat sink 100.

Thus, it should be noted that, with the present invention, components of the MOS-type and of the bipolar-type can be associated in a same power integrated circuit.

GENERALIZED DISCLOSURE OF THE INVENTION

FIGS. 6–9 illustrate, in a generalized conceptual way, the various types of components that can be monolithically fabricated and assembled according to the present invention.

Figure 6:
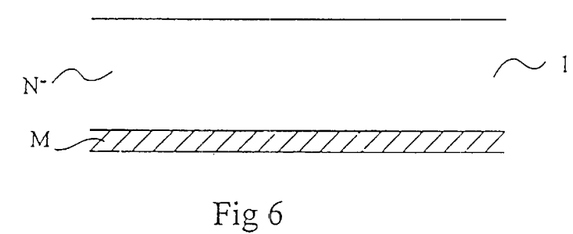
FIGS. 6, 7, 8 and 9 are generalized representations of the various types of components that can be monolithically assembled according to the present invention.

As represented in FIG. 6, conventional vertical components can be directly formed in an N⁻-type substrate 1 whose bottom surface is coated with a metallization which corresponds to a common electrode of these various vertical components.

Figure 7:
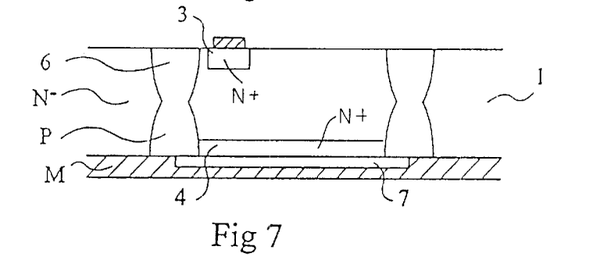

As represented in FIG. 7, a first category of autonomous components can be formed in an insulated section of the substrate, these components having on their bottom surface an active layer 4 of the same conductivity type as the substrate, but more highly doped. This layer is separated from the bottom surface metallization M by an insulating layer 7, and the contact with this layer is established through an additional highly doped region 3 formed on the upper surface of the substrate, which is of the same conductivity type as the substrate and faces at least a portion of layer 4. Of course, in this case, there will exist a resistance because of the substrate thickness between regions 3 and 4; so, this type of structure is preferably used for components liable to withstand high voltages but not designed to withstand high current densities.

Figure 8A:
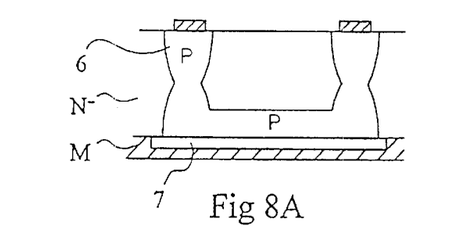

As represented in FIG. 8A, a second category of autonomous components can be formed in an insulated section of the substrate. These components have on the bottom surface an active layer of the conductivity type opposite to the conductivity type of the substrate. In this case, contact is taken through the insulation walls 6. Since these insulation walls can be relatively highly doped, such components can be used as high power components. In this case, the insulating layer 7 should lie beneath the bottom surface of the component and extend up to the external limits of the insulation walls.

Figure 8B:
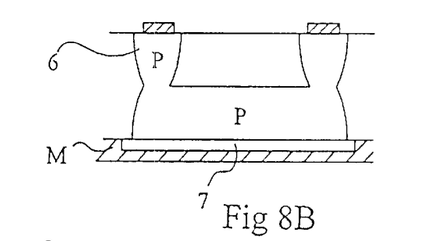

FIG. 8B represents an alternative embodiment wherein the P region of the lower surface is a relatively thick region substantially occupying one half of the thickness of the substrate and joining an insulation wall 6 formed from the upper surface.

Figure 9:
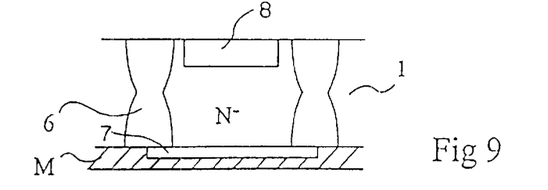

As represented in FIG. 9, a third category of autonomous components can be formed in an insulated section of the substrate. These components are designed to constitute logic circuits elements formed in a well 8 having a conductivity type opposite to that of the substrate.

Diode Bridge

An exemplary application of the monolithic assembly mode of power components according to the present invention is described hereinafter in relation to a diode bridge. A diode bridge, represented in FIG. 10A, includes four diodes D1–D4. The common anode of diodes D2 and D4 constitutes the negative bridge terminal T⁻; the common cathode of diodes D1 and D3 constitutes the positive bridge terminal T⁺; the junction of diodes D1–D2 and D3–D4 constitutes the a.c. supply terminals T1 and T2, respectively, of the bridge.

Figure 10A:
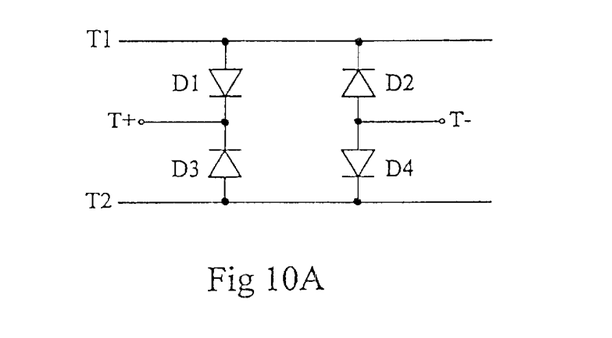
FIG. 10A represents a diode bridge.
Figure 10B:
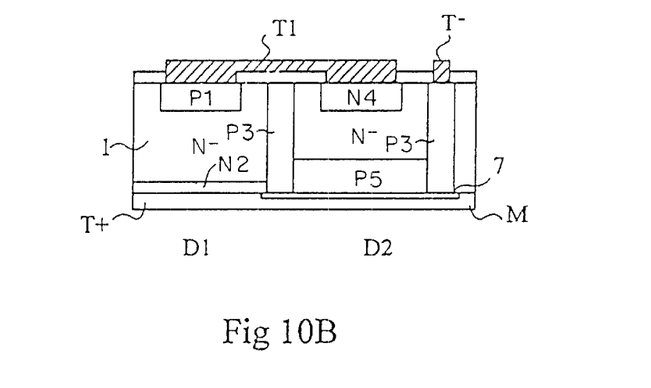
FIGS. 10B and 10C are a cross-sectional view and a schematic top view, respectively, of an embodiment according to the present invention of such a diode bridge.
Figure 10C:
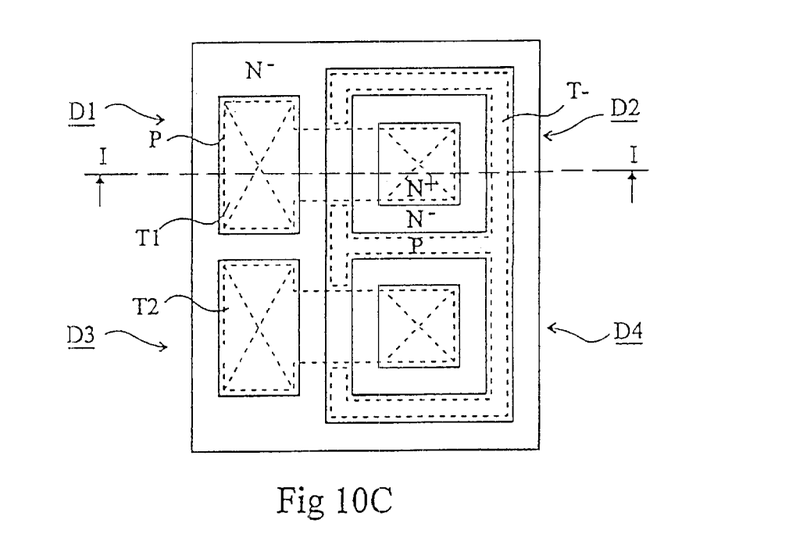

FIG. 10B is a cross-sectional view of an embodiment according to the present invention of the diode bridge of FIG. 10A. FIG. 10C is a top view of the diode bridge. FIG. 10B is a cross-sectional view along lines B—B of FIG. 10C.

As illustrated in FIGS. 10B and 10C, cathode-connected diodes D1 and D3 are conventional vertical diodes and include, on the upper surface of a low doped N-type substrate 1, a P-type region P1, and include, on the bottom surface, an N⁺-type region N2 contacting a lower metallization M which is metallization T⁺ of FIG. 10A. Diodes D2 and D4 are formed in insulated sections of substrate separated from the rest of the substrate by a P-type wall P3 obtained from deep diffusions achieved from the upper and bottom surfaces using conventional techniques. The bottom surface of these insulated regions and the bottom surface of wall P3 are protected by a dielectric material layer 7, such as silicon oxide. Each diode D2 and D4 includes, on its upper surface, an N⁺-type cathode region N4 formed in substrate N. These regions N4 are distinct for each diode D2 and D4. On the bottom surface, a P-type region P5 constitutes the common anode of diodes D2 and D4. The anode contact is taken from a metallization T⁻. A metallization T1 connects region P1 with region N4 whereas a metallization T2 (refer to FIG. 10C) connects the corresponding region of diode D3 to the corresponding region of diode D4.

In the top view, areas where metallizations T1 and T2 are contacting the semiconductive underlying areas are represented by crosses, the remaining portions of these metallizations being formed on an oxide layer.

Protected Rectifying Bridge

Figure 11A:
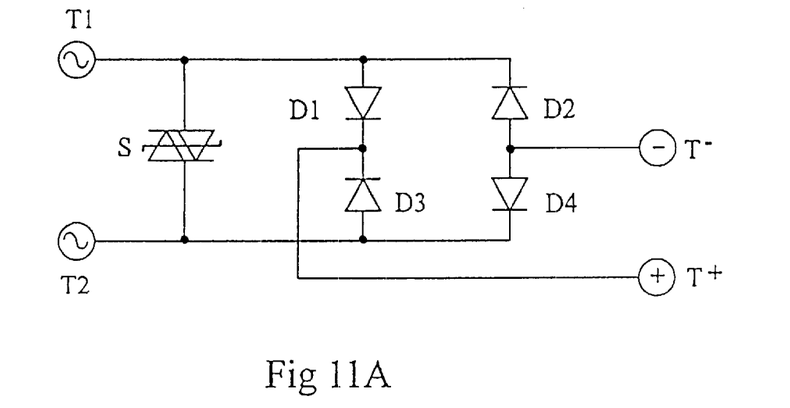
FIGS. 11A, 11B, 11C, 12A, 12B, 13A, 13B, 14A, 14B, and 14C illustrate an application of the present invention to a rectifying bridge protected against overvoltages and overcurrents.

FIG. 11A illustrates a rectifying bridge including four diodes D1–D4 connected as in FIG. 10A.

To protect the diodes of the bridge and especially the components that can be connected to terminals T⁺ and T⁻, a bidirectional protection component S is usually used, such as a double Shockley diode disposed between terminals T1 and T2. This protection component allows, for example, protection against lightning that may strike a telephone line, or overvoltages caused by the contact between a telephone line and a mains line.

The circuit, represented in FIG. 11A, using a double Shockley diode as a protection element operates correctly, but needs the association of several discrete elements: a double Shockley diode, and a rectifying bridge. The bridge is also frequently fabricated in the form of two silicon components, each integrating a branch of the bridge, and which are mounted in the same casing.

It will be shown that the present invention allows the fabrication of such a bridge protected against overvoltages or overcurrents in the form of a monolithic component.

The present invention is based on an analysis of the circuit of FIG. 11A. The applicant has modified this circuit in order to fabricate it in a monolithic form. In particular, the applicant proposes alternative embodiments of the circuit of FIG. 11A such as depicted in FIGS. 11B and 11C.

Figure 11B:
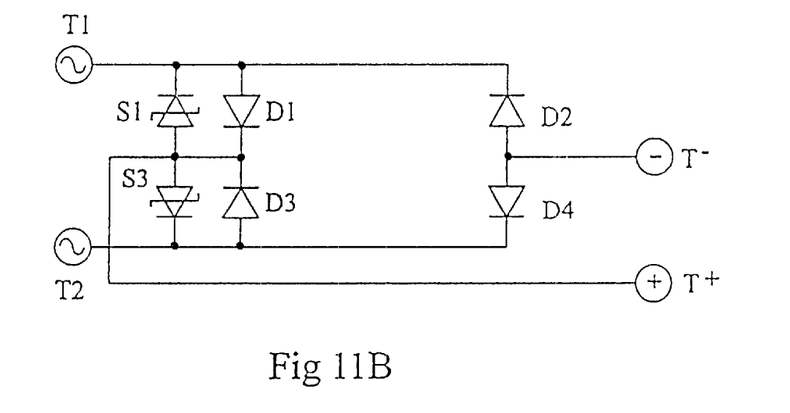

In the circuit of FIG. 11B, diode S is replaced by two head-to-tail unidirectional Shockley diodes, S1 and S3, connected between terminals T1 and T2, and whose common anode is connected to the common cathode of diodes D1 and D3.

Figure 11C:
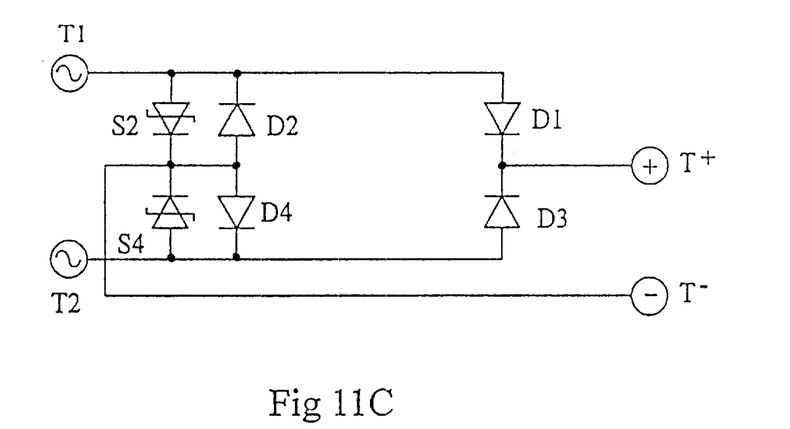

In the circuit of FIG. 11C, diode S is replaced by two head-to-tail unidirectional Shockley diodes, S2 and S4, connected between terminals T1 and T2, and whose common cathode is connected to the common anode of diodes D2 and D4.

In FIGS. 11B and 11C, diodes D1-S1, D3-S3, and D2-S2, D4-S4, respectively, have been disposed closer together because, as will be seen hereinafter, the proposed embodiment in the form of a monolithic component more particularly combines these diodes that have common terminals.

Figure 12A:
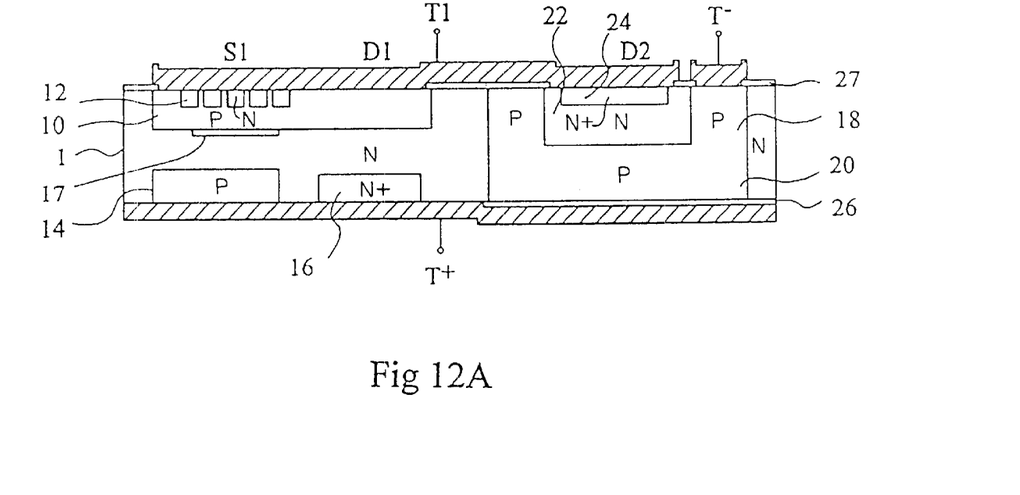
Figure 12B:
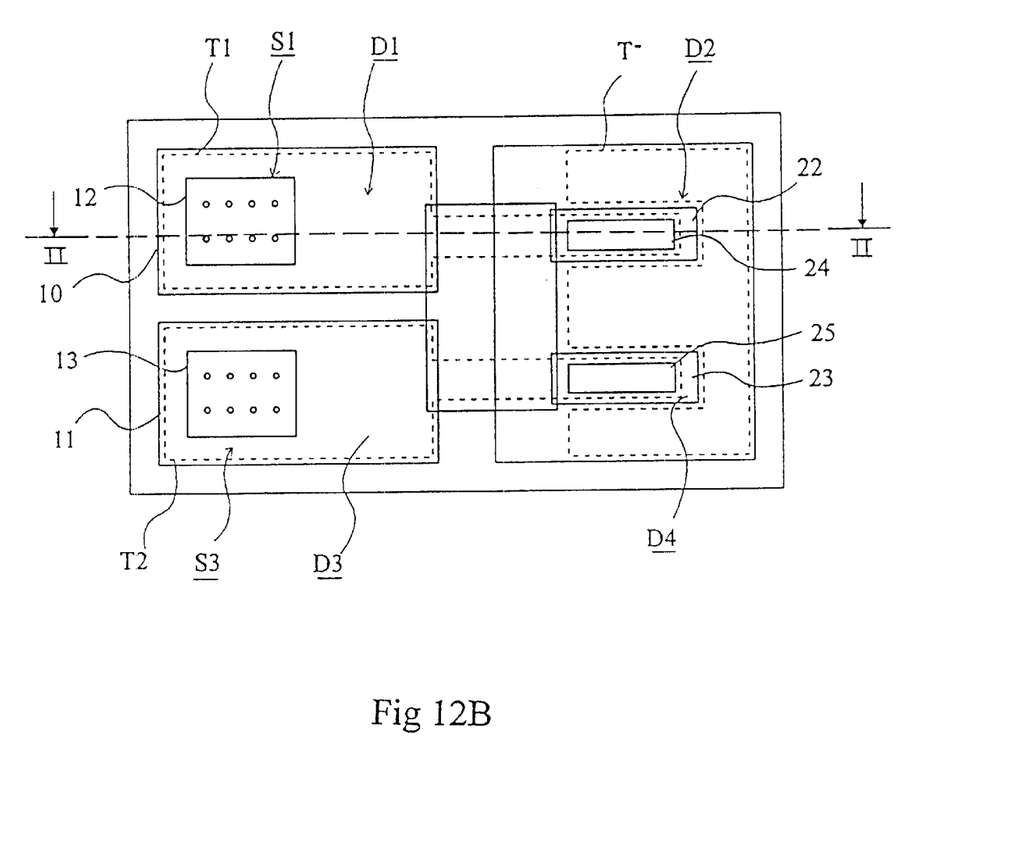

The component illustrated in FIGS. 12A and 12B, that implements the circuit of FIG. 11B, is fabricated using a low doped N-type silicon wafer 1. As shown in FIGS. 12A and 12B, the Shockley diodes S1 and S3, as well as diodes D1 and D3 connected in anti-parallel, are disposed vertically in the left-hand portion of the component, and diodes D2 and D4 are disposed in an insulated section in the right-hand portion of the component.

The left-hand portion of the component includes two P-type wells 10 and 11 formed from the upper surface of substrate 1. In substantially one half of the surface of each well 10 and 11 is formed an N-type region, 12 and 13, respectively, which constitutes the cathode of a Shockley diode S1, S3. Regions 12 and 13 are conventionally discontinuous so that portions of the material of wells 10, 11 extend upwardly through apertures provided in regions 12, 13 to form so-called emitter shorts. Substantially beneath each region 12 and 13, are formed from the bottom surface of the substrate P-type regions; in FIG. 12A, only region 14 disposed beneath region 12 is visible. These P-type regions constitute the anodes of the Shockley diodes. Beneath the portion of wells 10 and 11 that does not include the N-type regions 12 and 13, is formed from the bottom surface of the substrate an N$^+$-type region, of which only region 16 corresponding to the cathode of diode D1 is visible. Preferably, beneath region 12 (and symmetrically beneath region 13), at the interface between region 10 and substrate 1, an N-type region 17, that is more highly doped than the substrate, sets the breakover voltage of the Shockley diodes.

Diodes D2 and D4 are formed in the right-hand portion of FIGS. 12A and 12B. These diodes are disposed in insulated sections. In the embodiment of FIG. 12, the insulated sections are formed from a deep P-diffusion 18 extending from the upper surface and joining a deep P-diffusion 20 that is formed from the bottom surface. These P-type diffusions 18 and 20 delineate in the substrate two N-type wells 22 and 23 inside which are formed overdoped N$^+$-type areas, 24 and 25, respectively. The junction between the N-type well 22 and the P-type diffusions 18, 20 corresponds to diode D2, and the junction between the N-type well 23 and the P-type diffusions 18, 20 corresponds to diode D4.

The bottom surface of the P-type deep diffusion 20 is coated with an insulation layer, usually a silicon oxide layer, 26. Similarly, the upper surface of the component is coated with a silicon oxide layer, 27, etched at the places where it is desired to establish contacts between areas of the component and metallizations.

The bottom surface of the component is uniformly coated with a metallization that corresponds to terminal T$^+$ of the circuit of FIG. 11B. Referring to the top view, the metallization outline is drawn in dotted lines in FIG. 12B. A first metallization, corresponding to the a.c. supply terminal T1, contacts the upper surface of the N-type region 12, of well 10 and of the N$^+$-type region 24. A second metallization T2, corresponding to the second a.c. supply terminal T2, is symmetrically laid upon layer 13, well 11, and the upper surface of the N$^+$-type region 25. The upper surface of the P-type deep diffused region 18 is coated with a metallization corresponding to terminal T$^-$.

To fabricate a monolithic component corresponding to the circuit of FIG. 11C, the drawing of FIGS. 12A and 12B could be used by inverting all the conductivity types of the various layers. In practice, however, for technological reasons, it is often preferable to fabricate a monolithic component from an N-type semiconductor substrate.

Figure 13A:
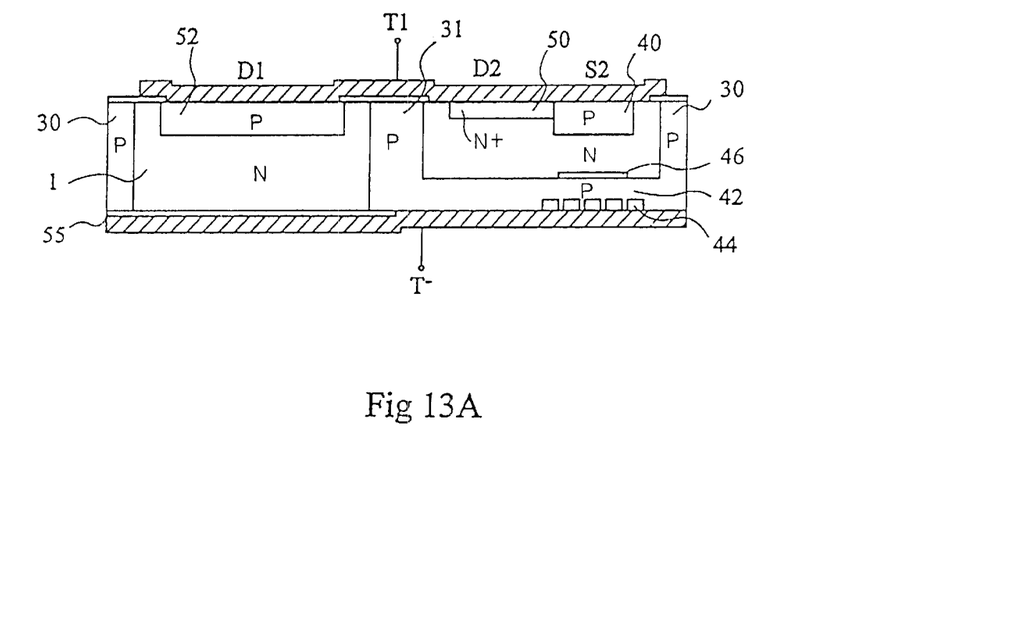
Figure 13B:
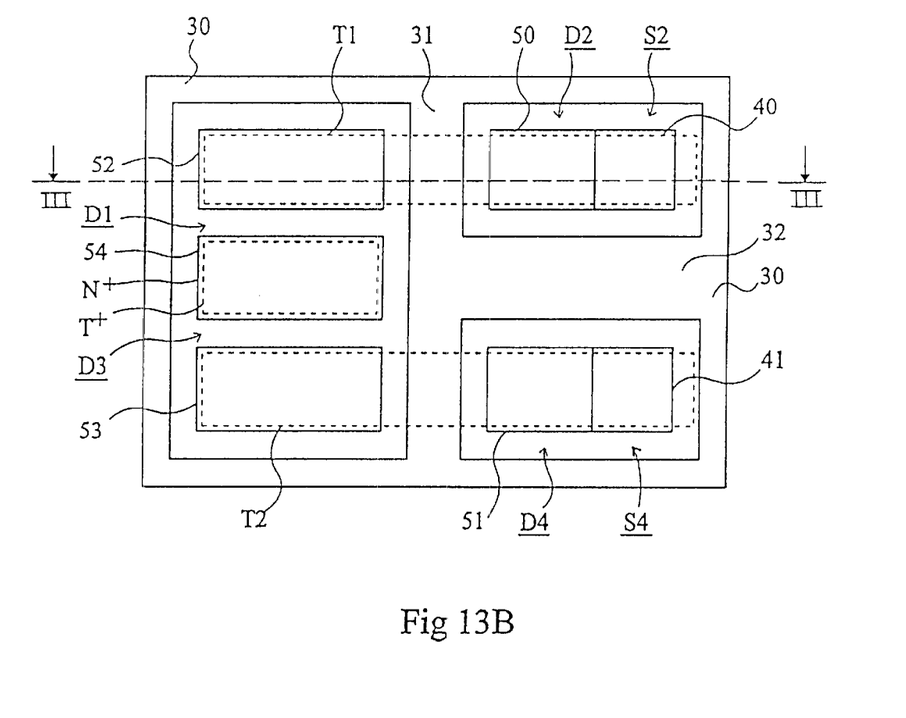

FIGS. 13A and 13B are a cross-sectional view and a top view, respectively, of an embodiment of a monolithic component according to the invention corresponding to the circuit of FIG. 11C. The component is formed from an N-type substrate, labeled 1 as previously. Diodes S2, D2, S4, S4 are disposed in the right-hand portion of the figure, and diodes D1, D3 are disposed in the left-hand portion.

The whole component is surrounded with a P-type wall 30 formed by the junction of an ascending diffusion and a descending diffusion that are realized from the bottom and upper surfaces. Simultaneously, a central wall 31, partitioning the wafer into two portions, is formed. Additionally, a wall 32 (refer to FIG. 13B) separates the regions where diodes D2-S2 and D4-S4 are formed.

The Shockley diode S2, visible in the cross-sectional view of FIG. 13A, includes, from the upper surface of the substrate, a P-type anode region 40, the N-type substrate 1, a P-type region 42 formed from the bottom surface and in which is formed an N-type region 44 provided, as the region 12 of FIG. 12, with emitter shorts. An N$^+$-type region 46 is formed at the interface of the P-type region 42 and of the N-type substrate to set the triggering threshold of the Shockley diode.

Diode D2 includes, from the upper surface to the bottom surface, an N$^+$-type region 50 that is adjacent to region 40, and that constitutes the cathode of diode D2. It also includes the N-type substrate, and an extension of the P-type region 42 that corresponds to the anode.

Diodes S4 and D4 are identical to diodes S2 and D2; they are represented as a top view in FIG. 13B that also shows regions 41 and 51 which correspond to regions 40 and 50, respectively.

Diodes D1 and D3 are formed in the left-hand portion of FIG. 13B, that is delineated by the insulation wall 30, 31. In the upper surface of the substrate are formed P-type regions 52 and 53 corresponding to the anodes of diodes D1 and D3, respectively, and an N$^+$-type region 54 corresponding to the common cathodes of diodes D1 and D3. The bottom surface of the well that is delineated by the insulation walls 30, 31 is coated with an insulation layer 55.

A metallization is formed on the bottom surface and corresponds to terminal T$^-$ of FIG. 11C. A metallization is formed on the N$^+$-type region 54 and corresponds to terminal T$^+$. A metallization corresponding to terminal T1 coats the P-type region 52, the N$^+$-type region 50 and the P-type region 40. A metallization corresponding to electrode T2 coats regions 53, 51 and 41.

It will clearly appear to those skilled in the art that the top views of FIGS. 12B and 13B are illustrative only. These top views are schematic and various shapes can be chosen by those skilled in the art, more particularly for the choice of the active areas of the various elements of the component, to provide desired conduction performance.

According to an alternative aspect, the present invention provides a component, also realized in a monolithic form, capable of constituting a rectifying bridge protected both against overvoltages and against overcurrents.

Figure 14A:
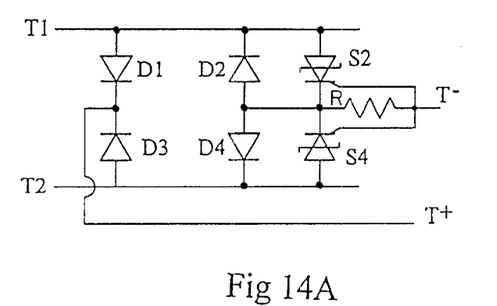

FIG. 14A is a diagram of a circuit providing such function. The Shockley diodes correspond to thyristors having their gates connected to terminal T$^-$, which is connected through a resistor R to the junction of the cathodes of these thyristors and to the junction of the anodes of diodes D2 and D4. Thus, components S2 and S4 can operate either as Shockley diodes, as above described, in case of an overvoltage, or as thyristors when the current in resistor R, i.e., the current in the rectifying bridge, exceeds a predetermined threshold.

Figure 14B:
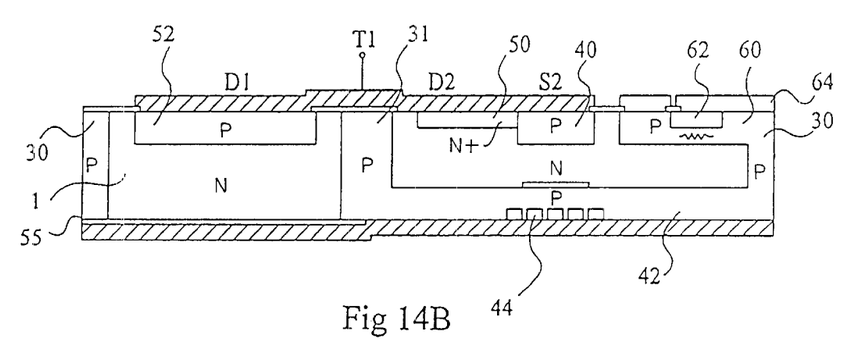
Figure 14C:
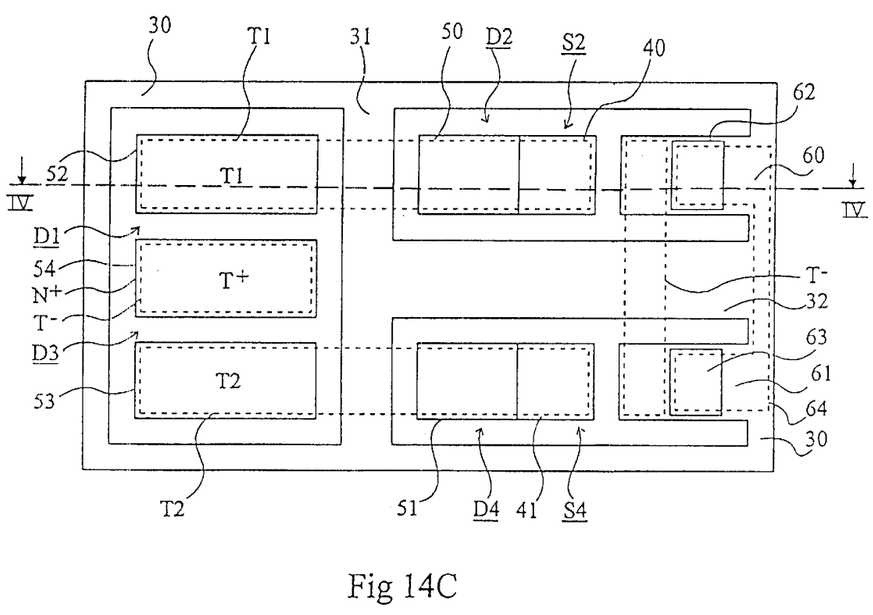

FIGS. 14B and 14C are a cross-sectional view and a top view, respectively, of a monolithic component, developed from the component of FIGS. 13A and 13B, allowing for the formation of the circuit of FIG. 14A. This component, on the left of a line a—a, is identical to the component illustrated in FIGS. 13A and 13B except that the bottom surface metallization is not connected. Same elements are designated with same reference characters, and the left-hand portion of FIGS. 14B and 14C will not be described again.

In the right-hand portion of the component of FIGS. 14B and 14C, on the bottom side, layer 42 is prolonged, as is the bottom surface metallization. On the upper side, additional P-type regions 60 and 61, not contacting the P-type region 40, extend to the P-type wall 30. N-type regions 62 and 63 are diffused in regions 60 and 61, respectively.

A metallization connected to terminal T⁻ contacts the P-type regions 60 and 61 on the side of these regions opposite to wall 30, the N-type diffusions 62 and 63 being disposed between this metallization and wall 30. Thus, the component bottom surface that previously formed terminal T⁻ is in this case connected to terminal T⁻ through wall 30 and the pinched off resistors, with respective values 2R, disposed beneath the N-type diffusions 62 and 63. An additional metallization 64, not connected to an external terminal, is formed on the upper surface of wall 30 and of regions 62 and 63. Under normal operation, the parallel resistors 2R are connected between an input terminal of the bridge and the output terminal T⁻ of the bridge.

Should an overvoltage occur and render, for example, the Shockley diode S2 conductive, this overvoltage is drained off through diode S2 and diode D4 following the path including metallization T1, the P-type region 40, the N-type substrate, the P-type region 42, the N-type region 44, the bottom surface metallization, the P-type region 42, substrate 1 and the anode region 51 of the diode D4 connected to metallization T2. This path is not shown in the cross-sectional view of FIG. 14B drawn along line B—B of FIG. 14C since it involves the lower portion of the top view of FIG. 14C.

Now, assume that, during normal operation of the rectifying bridge D1–D4, an overcurrent occurs while a current flows between terminal T1 and terminal T⁻ through diode D2, that is, the current follows the path from metallization T1, region 50, substrate 1, region 42, the bottom metallization, wall 30, towards metallization T⁻. Between wall 30 and metallization T⁻, the current is split in two fractions; one fraction passes through layer 60 beneath region 62, the second fraction passes through layer 61 beneath region 63. Each path has a resistance equal to 2R. Hence, the equivalent resistance is equal to R. When the current in the resistor pinched off beneath the diffused region 62 or 63 exceeds a predetermined value and the voltage drop across this resistor exceeds 0.7 volt, the PN junctions 60–62 and 61–63 become conductive. Junction 61–63 is part of a thyristor in which the N-type region 63 constitutes the cathode, the P-type region 61 constitutes the cathode gate region, the substrate constitutes the base, and the P-type region 40 or 41 constitutes the anode. Hence, this thyristor becomes conductive, and charges are injected into the substrate 1, which triggers the vertical Shockley diode S4. Then, the overcurrent is drained off through the Shockley diode S4 and diode D2 through a path not visible in the cross-sectional view of FIG. 14B.

The above described case corresponds to the case when the overcurrent occurs while terminal T2 is more positive than terminal T1. In this case, shorting occurs while diodes S4 and D2 are forward conducting, as indicated above. When terminal T1 is more positive than terminal T2, the same mechanisms trigger the Shockley diode S2 and shorting occurs through diodes D4 and S2.

Additionally, in the case above described, resistor R (formed by two resistors 2R connected in parallel) is integrated. It is possible to provide a resistor R external to the casing and having an adjustable value, which allows for the selection of the protection current threshold.

As is apparent to those skilled in the art, various modifications can be made to the above disclosed preferred embodiments. For example, the junction of diodes S2, S4, D2, D4 (FIG. 11C), or the junction of diodes S1, S3, D1, D3 (FIG. 11B) can be connected to an external terminal through an additional diode connected in anti-parallel with an additional Shockley diode to provide protection with respect to a reference voltage, such as ground. Then, it is preferable, in the case of the circuit of FIG. 12B, to duplicate the vertical structure including the assembly S1-D1 or the assembly S3-D3 and, in the embodiment of FIG. 13B, to duplicate the vertical pattern including the assembly S2-D2 or S4-D4.

These exemplary applications are illustrative only of the numerous possibilities existing in the design of high voltage power integrated circuit according to the invention allowing to fabricate autonomous power components in "insulated sections" of a substrate.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A circuit, comprising,
    a rectifier including first and second pairs of serially connected diodes disposed between a.c. supply terminals, junctions between the diodes of each pair of diodes each constituting a d.c. supply terminal, and
    two serially connected Shockley diodes in anti-parallel with the diodes of the first pair of diodes, the junction between the diodes of the first pair of diodes being operatively connected to a junction between the Shockley diodes.

2. The circuit of claim 1, wherein the diodes of the first pair of diodes are connected by their anodes.

3. The circuit of claim 1, wherein the diodes of the first pair of diodes are connected by their cathodes.

4. The circuit of claim 1, further including triggers, wherein the Shockley diodes are responsive to the triggers, enabling them to act as thyristors and as Shockley diodes.

5. The circuit of claim 4, wherein the first and second pairs of diodes and the Shockley diodes are disposed together in a monolithic semiconductor component.

6. The circuit of claim 4, further including a resistor between the triggers and one of the d.c. supply terminals.

7. The circuit of claim 6, wherein the first and second pairs of diodes, the Shockley diodes, and the resistor are disposed together in a monolithic semiconductor component.

8. The circuit of claim 6, wherein the resistor has a variable resistance.

9. The circuit of claim 1, wherein the first and second pairs of diodes and the Shockley diodes are disposed together in a monolithic semiconductor component.

10. The circuit of claim 1, wherein the rectifier comprises a single-phase bridge rectifier.

11. A protection circuit for an electrical element, comprising:
    a rectifier responsive to an alternating voltage and operative to provide a rectified current through the element, a pair of Shockley diodes responsive to the alternating voltage and operative to protect the element against overvoltages occurring in the alternating voltage, and a pair of triggers responsive to current in the element and operative to trigger the same Shockley diodes to cause them to act as thyristors in response to overcurrent through the element.

12. The circuit of claim 11, wherein the rectifier, the Shockley diodes, and the triggers are disposed together in a monolithic semiconductor component.

13. The circuit of claim 11, further including a resistor between the triggers and one of the d.c. supply terminals.

14. The circuit of claim 13, wherein the rectifier, the Shockley diodes, the resistor, and the triggers are disposed together in a monolithic semiconductor component.

15. The circuit of claim 13, wherein the resistor has a variable resistance.

16. The circuit of claim 11, wherein the rectifier comprises a single-phase bridge rectifier.

17. Means for protecting an electrical element, comprising:

rectifying means for rectifing an alternating voltage to provide a rectified current through the element, Shockley diode means for protecting the electrical element against overvoltages occurring in the alternating voltage, and triggering means for protecting the electrical element against overcurrent by triggering the same Shockley diode means to cause it to act as thyristor means.

18. The means of claim 17, wherein the rectifying means, the Shockley diode means, and the triggering means are disposed together in a monolithic semiconductor means.

19. The means of claim 17, further including a resistive means between the triggering means and one of the d.c. supply terminal means.

20. The means of claim 19, wherein the rectifier, the Shockley diode means, the resistive means, and the trigger means are disposed together in a monolithic semiconductor means.

21. The means of claim 19, wherein the resistive means has a variable resistance.

22. The means of claim 17, wherein the rectifying means comprises single-phase bridge rectifying means.

* * * * *

UNITED STATES PATENT AND TRADEMARK OFFICE
CERTIFICATE OF CORRECTION

PATENT NO. : 6,411,155 B2
DATED : June 25, 2002
INVENTOR(S) : Robert Pezzani

It is certified that error appears in the above-identified patent and that said Letters Patent is hereby corrected as shown below:

Column 2,
Lines 11-26, should read as follows:
-- The invention also applies to a component forming a single-phase rectifying bridge that includes first and second pairs of serially connected diodes disposed between a.c. supply terminals, the junctions between the diodes of each pair of diodes constituting a d.c. supply terminal, and two serially connected Shockley diodes in anti-parallel with the diodes of the first pair of diodes. The Shockley diodes and the first pair of diodes are vertically disposed in a semiconductor substrate whose upper surface includes two first metallizations forming a.c. supply terminals, and whose bottom surface includes a third metallization forming a d.c. supply terminal corresponding to the junction of the first two diodes. The second pair of diodes is disposed in an insulated section between a fourth metallization forming a d.c. supply terminal and each metallization forming an a.c. supply terminal. --

Column 7, line 66 through Column 8, line 2,
Should read as follows:
-- Fig. 10B is a cross-sectional view of an embodiment according to the present invention of the diode bridge of Fig. 10A. Fig. 10C is a top view of the diode bridge. Fig. 10B is a cross-sectional view along lines I-I of Fig. 10C. --

Column 8,
Lines 53-62, the language "head-to-tail" was deleted from lines 54 and 59 and should read as follows:
-- In the circuit of Fig. 11B, diode S is replaced by two unidirectional Shockley diodes, S1 and S3, connected between terminals T1 and T2, and whose common anode is connected to the common cathode of diodes D1 and D3.

In the circuit of Fig. 11C, diode S is replaced by two unidirectional Shockley diodes, S2 and S4, connected between terminals T1 and T2, and whose common cathode is connected to the common anode of diodes D2 and D4. --

Column 10, line 66 through column 11, line 7,
Should read as follows:
-- Figs. 14B and 14C are a cross-sectional view and a top view, respectively, of a monolithic component, developed from the component of Figs. 13A and 13B, allowing for the formation of the circuit of Fig. 14A. This component is identical to the component illustrated in Figs. 13A and 13B except that the bottom surface metallization is not connected. Same elements are designated with same reference characters, and the left-hand portion of Figs. 14B and 14C will not be described again. --

UNITED STATES PATENT AND TRADEMARK OFFICE
CERTIFICATE OF CORRECTION

PATENT NO. : 6,411,155 B2
DATED : June 25, 2002
INVENTOR(S) : Robert Pezzani

It is certified that error appears in the above-identified patent and that said Letters Patent is hereby corrected as shown below:

<u>Column 11,</u>
Lines 26-36, should read as follows:
-- Should an overvoltage occur and render, for example, the Shockley diode S2 conductive, this overvoltage is drained off through diode S2 and diode D4 following the path including metallization T1, the P-type region 40, the N-type substrate, the P-type region 42, the N-type region 44, the bottom surface metallization, the P-type region 42, substrate 1 and the anode region 51 of the diode D4 connected to metallization T2. This path is not shown in the cross-sectional view of Fig. 14B drawn along line IV-IV of Fig. 14C since it involves the lower portion of the top view of Fig. 14C. --

Signed and Sealed this

Twelfth Day of November, 2002

Attest:

Attesting Officer

JAMES E. ROGAN
*Director of the United States Patent and Trademark Office*